(12) United States Patent
Tanishima

(10) Patent No.: US 6,924,673 B2
(45) Date of Patent: Aug. 2, 2005

(54) INPUT/OUTPUT BUFFER FOR PROTECTING A CIRCUIT FROM SIGNALS RECEIVED FROM EXTERNAL DEVICES AND METHOD OF USE

(75) Inventor: Hideaki Tanishima, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/368,409

(22) Filed: Feb. 20, 2003

(65) Prior Publication Data

US 2003/0222684 A1 Dec. 4, 2003

(30) Foreign Application Priority Data

May 31, 2002 (JP) ........................................ 2002-159696

(51) Int. Cl.[7] ............................................... H03K 3/00
(52) U.S. Cl. ..................................... 327/108; 327/544
(58) Field of Search ......................... 327/108–112, 309, 327/314, 315, 318–320, 325, 544

(56) References Cited

U.S. PATENT DOCUMENTS

| | | |
|---|---|---|
| 4,460,985 A | 7/1984 | Hoffman |
| 5,144,585 A | 9/1992 | Jin et al. |
| 5,304,865 A | 4/1994 | Schoofs |
| 5,757,225 A * | 5/1998 | Tobita ........................ 327/539 |
| 5,783,934 A * | 7/1998 | Tran ........................... 323/312 |
| 5,929,539 A | 7/1999 | Kozaru et al. |
| 6,008,674 A | 12/1999 | Wada et al. |
| 6,084,462 A | 7/2000 | Barker, Jr. |
| 6,157,974 A | 12/2000 | Gasparik |
| 6,327,635 B1 | 12/2001 | Craven et al. |

FOREIGN PATENT DOCUMENTS

JP     2000-029551     1/2000

* cited by examiner

*Primary Examiner*—Kenneth B. Wells
(74) *Attorney, Agent, or Firm*—Arent Fox PLLC

(57) ABSTRACT

An input/output buffer that protects a circuit from voltage signals provided from an external device. The input/output buffer includes a reference power generation circuit connected to a high voltage power supply and a low voltage power supply to convert the voltage of an external voltage signal and generate reference power. The reference power generation circuit has a protection circuit including a plurality of MOS transistors for decreasing the voltage of the external voltage signal to a predetermined voltage when the input/output buffer is not supplied with the voltage of the high voltage power supply. Each of the MOS transistors has a back gate connected to a predetermined node at which the voltage is less than the voltage of the high voltage power supply and greater than the voltage of the low voltage power supply.

19 Claims, 16 Drawing Sheets

- 1, 8, 9, 15 : +5V Power Supply Terminal
- 4, 5, 12 : Ground Terminal
- 2, 7, 10, 14 : Digital Input (A1, A2, B1, B2) Terminal
- 3, 6, 11, 13 : Analog Input (AX, AY, BX, BY) Terminal

Fig. 14

| Gate for Transistor | VDE=ON | | | VDE=OFF | | |
|---|---|---|---|---|---|---|
| | EB=VSS | EB=VDE | EB=6V | EB=VSS | EB=VDE | EB=6V |
| Gate of Pt15 | 2.48V | 3.30V | 5.59V | 0V | 3.17V | 5.66V |
| Gate of Pt14 | 2.17V | | 5.06V | | 2.96V | 5.19V |
| Gate of Pt13 | 2.93V | | 4.52V | | 2.74V | 4.73V |
| Gate of Pt12 | 3.08V | | 3.84V | | 2.25V | 4.09V |
| Gate of Pt11 | 3.30V | | 3.30V | | 2.07V | 3.62V |
| VDO | 3.30V | | 3.30V | | 2.07V | 3.62V |

Fig.22A
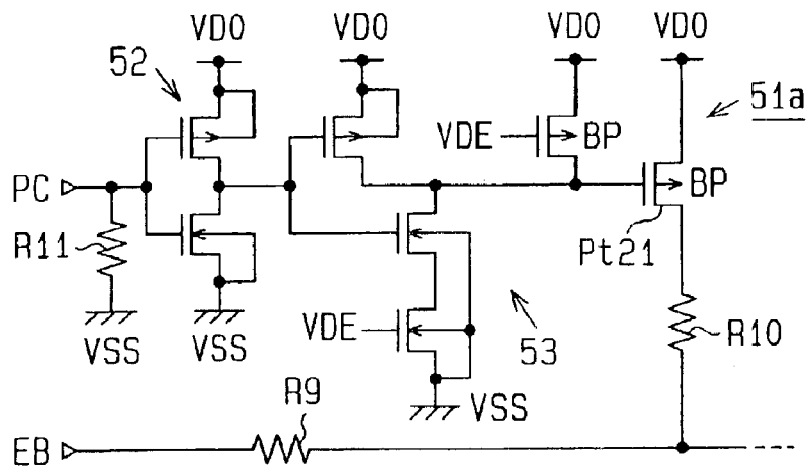
Fig.22B
| VDE | PC | P-Gate | |
|---|---|---|---|
| 1 (3.3 V) | 0 | L | Normal |
| 1 (3.3 V) | 1 | H | Test |
| 0 (0 V) | 0 | H | Fail-Safe |
| 0 (0 V) | 1 (0) | H | Fail-Safe |
Fig.23A
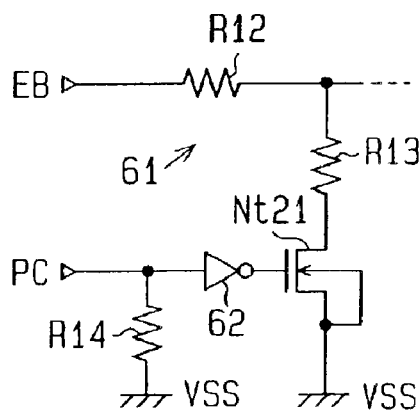
Fig.23B
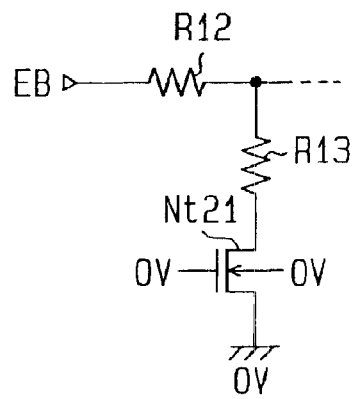

| VDE | PC | N-Gate | |
|---|---|---|---|
| 1 (3.3 V) | 0 | H | Normal |
| 1 (3.3 V) | 1 | L | Test |
| 0 (0 V) | 0 | L | Fail-Safe |
| 0 (0 V) | 1 (0) | L | Fail-Safe |

| A | B | S | X |
|---|---|---|---|
| BP | VSS | 1 (3.3 V) | VSS |
| | | 0 (0 V) | BP |

INPUT/OUTPUT BUFFER FOR PROTECTING A CIRCUIT FROM SIGNALS RECEIVED FROM EXTERNAL DEVICES AND METHOD OF USE

CROSS-REFERENCE TO RELATED APPLICATION

This application is based upon and claims the benefit of priority of Japanese Patent Applications No. 2002-159696, filed on May 31, 2002, the contents being incorporated herein by reference.

BACKGROUND OF THE INVENTION

The present invention relates to an input/output buffer, an input buffer, and an output buffer.

Due to the recent progress in multimedia and the popularity of asymmetric digital subscriber line (ADSL) and wireless LAN, the number of households having personal computers (PC) has increased. It is required that the power consumption be reduced in peripheral equipment of a personal computer. Thus, the circuits of the peripheral equipment are miniaturized and operated with low voltage. Such low voltage circuits must be protected when the circuits are not supplied with power or when the low voltage circuits are provided with a voltage signal that is greater than the operational voltage.

A PC is normally connected to a display, a mouse, a printer, a memory, a modem, or a game device by means of a bus or an input/output port (I/O port).

A bus is classified as an internal bus or an external bus. The internal bus connects the CPU and the memory. The external bus connects the CPU and an I/O port (e.g., graphic board or SCSI board). Examples of an external bus include, for example, industrial standard architecture (ISA), peripheral component interconnect (PCI), small computer system interface (SCSI), IEEE 1394, universal serial bus (USB), integrated drive electronics (IDE), and AT attachment (ATA).

The I/O port is an interface connecting the PC and the peripheral equipment and normally includes a port exclusive connector. The I/O port includes a serial port connected to, for example, a mouse and modem, a parallel port connected to a printer, and a game port connected to a game device.

FIG. 1 is an explanatory diagram illustrating a layout example of connection pins in a game port (joystick port), which is connected to a joystick. A joystick port connector 71, which includes +5 V (volts) power supply terminals, digital input terminals, analog input terminal, and ground terminals, may be connected to joysticks A and B. An example in which the joysticks A and B each have two buttons will now be discussed.

The +5 power terminals are normally directly connected to a motherboard, and current flows through the +5 power supply terminals to the motherboard. Digital signals (A1, A2, A3, A4 in FIG. 1) are input from the buttons of the joysticks A and B, which are connected to the port. The digital input terminals receive, for example, a signal having a low level (V) when the buttons of the joysticks A and B are pushed and a signal having a high level when the buttons of the joysticks A and B are not pushed.

The analog input terminals receive an analog signal (AX, AY, BX, BY) that is in accordance with the resistances of the joysticks A and B.

More specifically, the joystick port includes a one shot multivibrator 72 as shown in FIG. 2, which is connected to an analog input terminal via an input/output buffer 73. A resistor 74 having a resistance of, for example, 2.2 kΩ is connected between the analog input terminals and the multivibrator 72. A 0.011 μF timing capacitor 75 is connected between the output terminal of the multivibrator 72 and a ground terminal. The joysticks A and B each have a variable resistor 76 (0 to 100 kΩ). The resistor 76 has a first terminal connected to a +5 power supply terminal and a second terminal connected to the analog input terminal.

When the analog input terminal is provided with an analog signal from the joysticks A and B, the multivibrator 72 generates an output signal having a high level (5 V). The high output signal charges the capacitor 75. When the voltage of the capacitor 75 reaches 3.3 V, the multivibrator 72 generates a signal at a low level (0 V). When the multivibrator 72 is outputting the high signal, the resistance of the joysticks A and B is proportional to the resistance of the variable resistors 76. In other words, position information of the joysticks A and B may be detected from the resistance of the variable resistor 76.

Due to the decrease in the operational voltage of the interface (I/O port), the circuits used in peripheral equipment are not operated under the same power supply voltage. Thus, an input/output buffer for the I/O port must be able to accept signals having a voltage that is greater than the operational voltage of the input/output buffer.

For example, when the power supply voltage of the input/output buffer 73 is 3.3 V, a 5 V voltage signal for operating the joysticks A and B is input to the input terminal of the input/output buffer 73. In this case, the input/output buffer 73 must be able to accept a 5 V voltage signal.

The following input/output buffers are known to be able to accept signals having a voltage that is greater than the power supply voltage:

first prior art example, input/output buffer having a tolerant function; and second prior art example, input/output buffer having a voltage resistance function at a circuit section to which a voltage signal, which is greater than the operational voltage, is applied in the input/output buffer.

FIG. 3 is a schematic block diagram of an input/output buffer 81 according to the first prior art example. The input/output buffer 81 includes an input/output circuit 82, an input circuit 83, an output circuit 84, and a tolerant circuit 85.

The input/output circuit 82 sends a voltage signal EB, which is an external input signal, to the input circuit 83 and the tolerant circuit 85. The tolerant circuit 85 generates a voltage signal BP having a voltage that is in accordance with the input voltage signal EB. The input circuit 83 generates a signal X by adjusting the voltage signal EB (external input signal) to an optimal signal X and outputting the signal X to an internal circuit (not shown).

The output circuit 84 receives a data signal A and an output control signal C from the internal circuit. The output circuit 84 generates control signals AP and AN in accordance with an output control signal C and provides the control signals AP and AN to the input/output circuit 82. The input/output circuit 82 generates the voltage signal EB in response to the control signals AP and AN and sends the voltage signal EB to the external equipment.

The circuits of the input/output buffer 81 will be described in more detail. The output circuit is a generally used circuit and thus will not be discussed.

FIG. 4 is a circuit diagram of the input/output circuit 82. The input/output circuit 82 includes p-channel MOS transistors (PMOS transistors) Pt1 and Pt2 and n-channel MOS transistors (NMOS transistors) Nt1 and Nt2.

The transistors Pt1 and Pt2 are connected in series, and the source of the transistor Pt1 is connected to a first high voltage power supply VDE. The gate of the transistor Pt1 receives the control signal AP from the output circuit 84. The drain of the transistor Pt1 is connected to the source of the transistor Pt2. The gate of the transistor Pt2 is connected to a low voltage power supply VSS, and the drain of the transistor Pt2 is connected to the drain of the transistor Nt1.

The back gates of the transistor Pt1 and the transistor Pt2 are each connected to the output of the tolerant circuit 85 and has substantially the same voltage as the voltage signal BP, which is generated by the tolerant circuit 85.

The transistors Nt1 and Nt2 are connected in series, and the source of the transistor Nt2 is connected to the low voltage power supply VSS. The drains of the transistors PT2, Nt1 are connected to each other, and a node N1 between the transistors Pt2 and Nt1 is connected to an input/output terminal 82a of the voltage signal EB. A first high voltage power supply VDE is a power supply for supplying an external circuit that is connected to the input/output buffer 81 with operational voltage and has, for example, a voltage of 3.3 V. The low voltage power supply VSS is the ground (GND).

The gate of the transistor Nt1 is connected to the first high voltage power supply VDE, and the back gate of the transistor Nt1 is connected to the low voltage power supply VSS. The gate of the transistor Bt2 receives the control signal AN from the output circuit 84, and the back gate of the transistor Nt2 is connected to the low voltage power supply VSS.

FIG. 5 is a circuit diagram of the tolerant circuit 85. The tolerant circuit 85 includes a resistor R1 and PMOS transistors Pt3 to Pt5.

The resistor R1, which is an input protection circuit, has one end connected to the node N1 (input/output circuit 82) of the input/output circuit 82 and another end connected to the gate of the transistor Pt3. The resistor R1 decreases the voltage of the voltage signal EB, which is input to the input/output circuit as an external input signal). The voltage signal EB of which voltage has been decreased (voltage signal EBR) is provided to the gate of the transistor Pt3.

The source of the transistor Pt3 is connected to the first high voltage power supply VDE, and the drain of the transistor Pt3 is connected to the source of the transistor Pt4. The transistors Pt4 and Pt5 are connected in series and have gates that are connected to the first high voltage power supply VDE. The drain of the transistor Pt5 is connected to a node N2 between the resistor R1 and the transistor Pt3. The drain of the transistor Pt5 is provided with the gate voltage of the transistor Pt3 (voltage signal EBR).

The back gates of the transistors Pt3 to Pt5 are connected to the back gates of the other transistors and to a node between the transistors Pt3 and Pt4. The tolerant circuit 85 outputs the voltage signal BP, the voltage of which is the same as the voltage at the node between the transistors Pt3 and Pt4.

FIG. 6 is a circuit diagram of the input circuit 83. The input circuit 83 includes PMOS transistors Pt6 to Pt8 and NMOS transistors Nt3 to Nt7. The drain of the transistor Nt3 is connected to the first high voltage power supply VDE, and the source and gate of the transistor Nt3 are connected to each other. The transistors Nt4 and Nt5 are connected in series, and the gates of the transistors Nt4 and Nt5 are connected to the first high voltage power supply VDE. The source of the transistor Nt5 is connected to the node N2 of the tolerant circuit 85 and receives the gate voltage of the transistor Pt3 (voltage signal EBR). The drain of the transistor Nt4 is connected to the source of the transistor Nt3, and the voltage at node N3 between the transistors Nt4 and Nt3 is supplied to the gates of the transistors Pt7 and Nt6. The back gates of the transistors Nt3 to Nt5 are each connected to the low voltage power supply VSS.

The source of the transistor Pt6 is connected to the first high voltage power supply VDE, and the gate of the transistor Pt6 is connected to the node N2 of the tolerant circuit 85 to receive the voltage signal EBR. The drain of the transistor Pt6 is connected to the source of the transistor Pt7, and the transistor Pt7 is connected to the transistor Nt6. The source of the transistor Nt6 is connected to the low voltage power supply VSS. The back gates of the transistors Pt6 and Pt7 are connected to the output of the tolerant circuit 85 and have about the same voltage as the voltage signal BP. The back gate of the transistor Nt6 is connected to the low voltage power supply VSS.

The gates of the transistors Pt8 and Nt7 are connected to the drains of the transistors Pt7 and Nt6. The source of the transistor Pt8 is connected to a second high voltage power supply VDI, and the drain of the transistor Pt8 is connected to the drain of the transistor Nt7. The source of the transistor Nt7 is connected to the low voltage power supply VSS. The second high voltage power supply VDI is a power supply for supplying the internal circuit with operational voltage and has, for example, 1.8V. The back gate of the transistor Pt8 is connected to the second high voltage power supply VDI, and the back gate of the transistor Nt7 is connected to the low voltage power supply VSS. The signal X, which has the drain voltage of the transistors Pt8 and Nt7, is provided to the internal circuit (not shown).

An example in which the voltage signal EB (external input signal) is input to the input/output buffer 81 will now be discussed.

1. Case in which the voltage signal EB is close to the voltage of the low voltage power supply VSS:

In this case, the transistor Pt3 switches on in the tolerant circuit 85. Accordingly, the tolerant circuit 85 outputs the voltage signal BP, the voltage of which is the same as the first high voltage power supply VDE.

In the input circuit 83, the transistor Pt6 switches on and the source of the transistor Pt7 is connected to the first high voltage power supply VDE. In this state, the power supply VDE activates the transistors Nt4 and Nt5, and the transistor Nt3 is inactivated. This inputs the voltage signal EBR to the gates of the transistors, which in turn, activates the transistor Pt7 and inactivates the transistor Nt6. As a result, the gates of the transistors Pt8 and Nt7 are connected to the high voltage power supply VDE. This inactivates the transistor Pt8 and activates the transistor Nt7. Accordingly, the input circuit outputs the signal X, which has the voltage of the low voltage power supply VSS, that is, a low level.

2. Case in which the voltage signal EB is close to the voltage of the high voltage power supply VDE (under the condition that EB<VDE is satisfied):

In this case, in the tolerant circuit 85, it is difficult for the transistors Pt3 to Pt5 to switch on, and the transistors Pt3 to Pt5 substantially function as a series-connected resistor. Accordingly, the tolerant circuit 85 outputs the voltage signal EBR, or the voltage signal BP that has about the same voltage as the first high voltage power supply VDE.

In the input circuit 83, the transistor Pt6 switches off. In this state, although it is difficult for the transistors Nt3 to Nt5 to switch on since the gate-source voltage is small, a voltage signal having a voltage that is slightly lower than that of the high voltage power supply VED (e.g., the voltage signal being about 3.1 V when the high voltage power supply VDE has 3.3 V) is input to the gates of the transistors Pt7 and Nt6. In response to the voltage signal, the transistor Pt7 switches on and the transistor Nt6 switches on. As a result, the low voltage power supply VSS is connected to the gates of the transistors Pt8 and Nt7. This activates the transistor Pt8 and inactivates the transistor Nt7. Accordingly, the input circuit 83 outputs the voltage of the second high voltage power supply VDI, or the signal X at a high level.

3. Case in which the voltage signal EB exceeds the first high voltage power supply VDE:

In this case, in the tolerant circuit 85, the transistor Pt5 switches on since its source voltage (voltage signal EBR) is greater than the gate voltage (high voltage power supply VDE). In this state, the transistor Pt4 switches on in the same manner. Accordingly, the tolerant circuit 85 outputs the voltage signal BP, the voltage of which is about the same as that of the voltage signal EB.

In the input circuit 83, the transistor Pt6 is inactivated. In this state, the transistor Nt4 switches off since its source voltage (voltage signal EBR) is greater than the gate voltage (high voltage power supply VDE). In the same manner, the transistor Nt5 switches off. However, the gate voltage of the transistor Nt3 increases and activates the transistor Nt3. In this state, the gates of the transistors Pt7 and Nt6 are provided with the voltage signal, the voltage of which is decreased from that of the first high voltage power supply VDE by the threshold voltage of the transistor Nt3. In response to the voltage signal, the transistor Pt7 switches off, and the transistor Nt6 switches on. As a result, the gates of the transistors Pt8 and Nt7 are connected to the low voltage power supply VSS. This activates the transistor Pt8 and inactivates the transistor Nt7. Accordingly, the input circuit 83 outputs the voltage of the second high voltage power supply VDI, or the signal X at a high level.

The back gates of the transistors Pt6 and Pt7 have the same voltage as that of the voltage signal (voltage adjusted in accordance with the voltage signal EB). Thus, even if the voltage of the voltage signal EB is greater than that of the first high voltage power supply VDE, the gate voltage becomes greater than the back gate voltage and prevents the generation of a leak current in the transistors Pt6 and Pt7. Accordingly, the input/output buffer 81 adjusts the voltage signal EB to a proper voltage (the operational voltage of the internal circuit) and outputs the voltage signal EB even if an external input signal having the voltage signal EB (e.g., 5 V), which is greater than the operational voltage (3.3 V), is input to the input/output buffer 81.

When the first high voltage power supply VDE does not supply the input/output buffer 81 with power (inactivated state), devices may be damaged and a leakage current may flow in the input/output buffer 81. Normally, in a personal computer or the like, a power supply circuit is continuously supplied with power. In this state, a voltage signal may be input to the inactivated input/output buffer 81 from an external circuit. In such a case, the application of a voltage greater than the power supply voltage may damage devices or produce leakage current.

More specifically, if the high voltage signal EB is input to the input/output buffer from an external device when the input/output buffer 81 is not supplied with power (high voltage power supply VDE), voltage greater than that of the power supply VDE is applied between the gate and drain of the transistor Pt2 and the gate and source of the transistors Nt1, Pt3, Pt5, Pt6, and Nt5. In such a case, high voltage, which is greater than the operational voltage, is applied to the gate oxidization film of each transistor. This produces short circuits between gates and drains and between gates and sources. Thus, the input/output buffer 81 is not suitable for equipment having a hot plug function.

In the input/output buffer having a voltage resistance function at the predetermined circuit sections, the gate oxidization film that directly receives the high voltage signal must be formed thickly while the gate oxidization films of the other transistors are formed with the normal thickness. This increases the circuit cost and increases the processing time.

To solve the above problem, Japanese Laid-Open Patent Publication No. 2000-29551 uses a buffer protection circuit, which will now be discussed.

FIG. 7 is a circuit diagram of a prior art voltage generator 91, which is a buffer protection circuit. The voltage generator 91 includes PMOS transistors 92 to 94 and NMOS transistors 95 to 97. The source of the transistor 92 and the gate of the transistor 95 are connected to a power supply VDD. The drain of the transistor 95 is connected to the gate of the transistor 92, and the source of the transistor 95 is connected to a power supply VSS (ground). Two diode-connected transistors 96 and 97 are connected in series between the drain of the transistor 92 and a terminal PAD.

When the power supply voltage VDD exists, the voltage generator 91 generates the reference voltage VDD2 having about the same voltage as the power supply voltage VDD. When the power supply voltage VDD does not exist, the voltage generator 91 drops the voltage of the voltage signal input to the terminal PAD by a voltage corresponding to two diodes. The voltage generator 91 adjusts the voltage signal input to the terminal PAD to a proper voltage and generates reference voltage VDD2. This protects circuits from high voltage signals input to the terminal PAD regardless of whether or not the power supply VDD exists.

However, the voltage generator 91 (FIG. 7) has the shortcomings described below.

(1) The back gates of the transistors are connected to the power supply VSS (ground). Thus, when the power supply VDD does not exist (VDD=0), high voltage is applied between the gate and back gate of each of the transistors 96 and 97. This causes device deterioration. Such a shortcoming also occurs when the transistors 96 and 97 are PMOS transistors.

(2) To sufficiently control the voltage drop in the diode-connected transistors 96 and 97, the transistor 94 configures a DC path between the terminal and the power supply VSS. However, in the DC path, the voltage of the power supply VDD decreases to about the same voltage as the power supply VSS. Further, when the transistor 94 is activated, the reference voltage VDD2 decreases. Thus, the reference voltage VDD2 having the intended voltage level cannot be generated. When an NMOS transistor configures the transistor 94 and the power supply VSS configures the gate input of the transistor 94, the path through which current flows is eliminated. As a result, the high voltage signal input to the terminal PAD cannot be decreased to the proper voltage to generate the reference voltage VDD2.

(3) The forward direction of the diode configured by the transistors 96 and 97 is the direction from node A to the terminal PAD. Thus, when the voltage at node A becomes greater than that at the terminal PAD (e.g., if the voltage of the voltage signal provided to the terminal PAD is the same as the voltage of the power supply voltage (ground)), current flows from the node A to the terminal PAD. This decreases the reference voltage VDD2 and the reference voltage VDD2 cannot be generated with the intended voltage level. If a high voltage signal is input to the terminal PAD when PMOS transistors configure the transistors 96 and 97, the effect of junction temperature increases the resistance of each PMOS transistor. This increases the difference between the voltages applied to each PMOS transistor and damages the device.

SUMMARY OF THE INVENTION

It is an object of the present invention to provide an input/output buffer, an input buffer, and an output buffer that protect circuits from voltage signals provided by an external device regardless of whether power is being supplied.

To achieve the above object, the present invention provides an input/output buffer for use with a high voltage power supply and a low voltage power supply and receiving an external voltage signal. The input/output buffer includes a reference power generation circuit connectable to the high voltage power supply and the low voltage power supply for converting the voltage of the external voltage signal and generating reference power. The reference power generation circuit having a protection circuit including a plurality of MOS transistors for decreasing the voltage of the external voltage signal to a predetermined voltage when the input/output buffer receives the external voltage signal and is not supplied with the voltage of the high voltage power supply. Each of the MOS transistors has a back gate connected to a predetermined node at which the voltage is less than the voltage of the high voltage power supply and greater than the voltage of the low voltage power supply.

A further aspect of the present invention is an input/output buffer for receiving an external voltage signal via a resistor and a reference voltage signal. The input/output buffer having an input circuit including an n-channel MOS transistor and a comparator connected to the n-channel MOS transistor. The n-channel MOS transistor includes a source for receiving the external voltage signal via the resistor, a gate connected to the source, and a drain for receiving reference power, the voltage of which is divided by a divisional resistor. The comparator compares the external voltage signal with the reference voltage signal to determine whether the voltage of the external voltage signal is greater than a predetermined threshold voltage from the comparison.

A further aspect of the present invention is a method for protecting an input/output buffer from a voltage signal that is provided from an external device. The input/output buffer is connected to a high voltage power supply and a low voltage power supply and includes an input/output circuit for transferring data with the external device. The method including decreasing the voltage of the voltage signal to a predetermined voltage with a plurality of MOS transistors, which are connected in series between the high voltage power supply and the low voltage power supply. Each MOS transistor has a back gate to generate reference power when the input/output buffer is not supplied with the voltage of the high voltage power supply. The method further includes supplying the input/output circuit with the reference power, and supplying the back gate of each MOS transistor with voltage that is less than the voltage of the high voltage power supply and greater than the voltage of the low voltage power supply.

A further aspect of the present invention is an input buffer for use with a high voltage power supply and a low voltage power supply and for receiving an external voltage signal. The input buffer includes a reference power generation circuit connectable to the high voltage power supply and the low voltage power supply for converting the voltage of the external voltage signal and generating reference power. The reference power generation circuit having a protection circuit including a plurality of MOS transistors for decreasing the voltage of the external voltage signal to a predetermined voltage when the external voltage signal is received and the voltage of the high voltage power supply is not supplied. Each of the MOS transistors has a back gate connected to a predetermined node at which the voltage is less than the voltage of the high voltage power supply and greater than the voltage of the low voltage power supply.

A further aspect of the present invention is an input buffer for receiving an external voltage signal via a resistor and a reference voltage signal. The input buffer has an input circuit including an n-channel MOS transistor and a comparator connected to the n-channel MOS transistor. The n-channel MOS transistor includes a source for receiving the external voltage signal via the resistor, a gate connected to the source, and a drain for receiving reference power, the voltage of which is divided by a divisional resistor. The comparator compares the external voltage signal with the reference voltage signal to determine whether the voltage of the external voltage signal is greater than a predetermined threshold voltage from the comparison.

A further aspect of the present invention is an output buffer for use with a high voltage power supply and a low voltage power supply and receiving an external voltage signal. The output buffer includes a reference power generation circuit connectable to the high voltage power supply and the low voltage power supply for converting the voltage of the external voltage signal and generating reference power. The reference power generation circuit has a protection circuit including a plurality of MOS transistors for decreasing the voltage of the external voltage signal to a predetermined voltage when the output buffer receives the external voltage signal and is not supplied with the voltage of the high voltage power supply. Each of the MOS transistors has a back gate connected to a predetermined node at which the voltage is less than the voltage of the high voltage power supply and greater than the voltage of the low voltage power supply.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 14 is an explanatory diagram illustrating an operation example of the power generation circuit of FIG. 12;

FIGS. 22A and 22B are explanatory diagrams illustrating the input buffer of FIGS. 21A to 21C provided with a fail-safe function;

FIGS. 23A and 23B are explanatory diagrams illustrating the pull-up input buffer of the fourth embodiment;

DETAILED DESCRIPTION OF THE PREFERRED EMBODIMENTS

Figure 1:
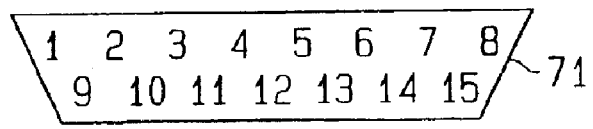
FIG. 1 is an explanatory diagram illustrating connection pins of a joystick port in the prior art.
Figure 2:
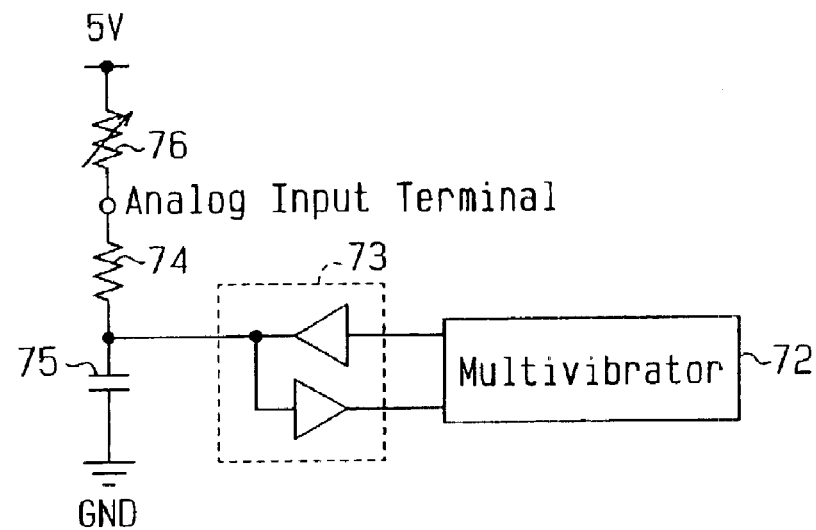
FIG. 2 is an explanatory diagram illustrating an analog input of a joystick port.
Figure 3:
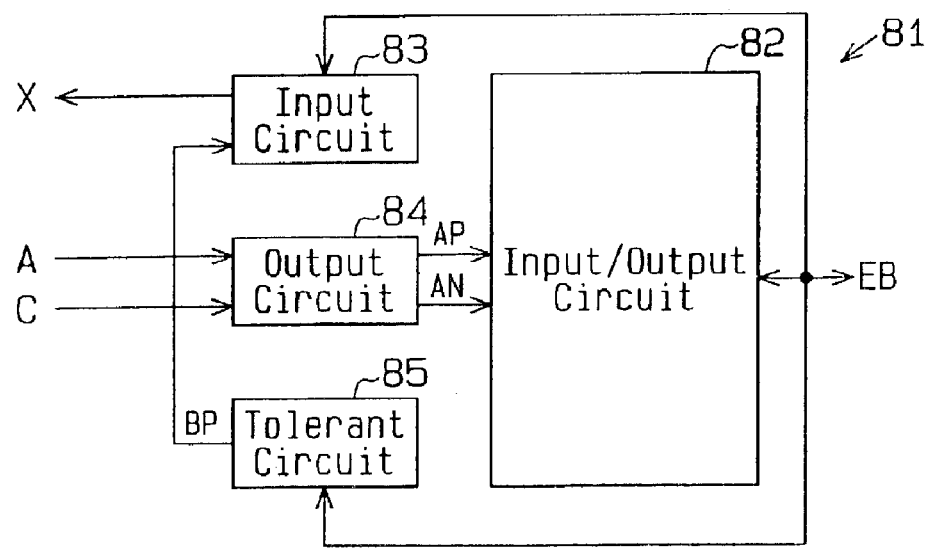
FIG. 3 is a schematic block diagram of a prior art input/output buffer.

In the drawings, like numerals are used for like elements throughout.

Figure 8:
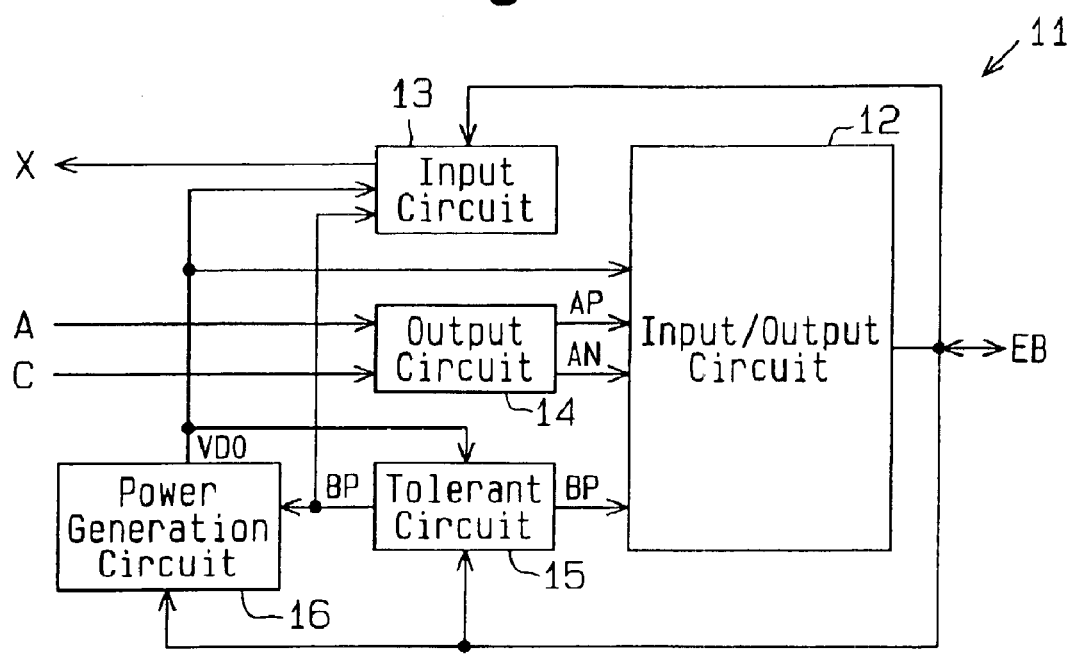
FIG. 8 is a schematic block diagram illustrating an input/output buffer according to a first embodiment of the present invention.

FIG. 8 is a schematic block diagram of an input/output buffer 11 according to a first embodiment of the present invention. The input/output buffer 11 includes an input/output circuit 12, an input circuit 13, an output circuit 14, a tolerant circuit 15, and a power generation circuit (reference power generation circuit) 16.

The input/output circuit 12 provides a voltage signal EB, which is an external input signal EB, to the input circuit 13, the tolerant circuit 15, and the power generation circuit 16. In accordance with the voltage of the voltage signal EB, the power generation circuit 16 generates operational power (reference power) VDO for the input/output buffer 11. The power generation circuit 16 provides the reference power VDO to the input/output circuit 12, the input circuit 13, and the tolerant circuit 15. The tolerant circuit 15 generates a voltage signal BP, the voltage of which corresponds with the input voltage signal EB. In accordance with the reference power VDO, the input circuit 13 adjusts the voltage signal EB to a proper voltage to generate a signal X and outputs the signal X to an internal circuit (not shown).

When the output circuit 14 receives a data signal A and an output control signal C from the internal circuit, the output circuit 14 generates control signals AP and AN in accordance with an output control signal C. The control signals AP and AN are provided to the input/output circuit 12. In response to the control signals AP and AN, the input/output circuit 12 generates the voltage signal EB and outputs the voltage signal EB (output signal).

The configuration of each circuit in the input/output buffer 11 will now be discussed in detail. The output circuit 14 is a widely used circuit and thus will not be discussed.

Figure 4:
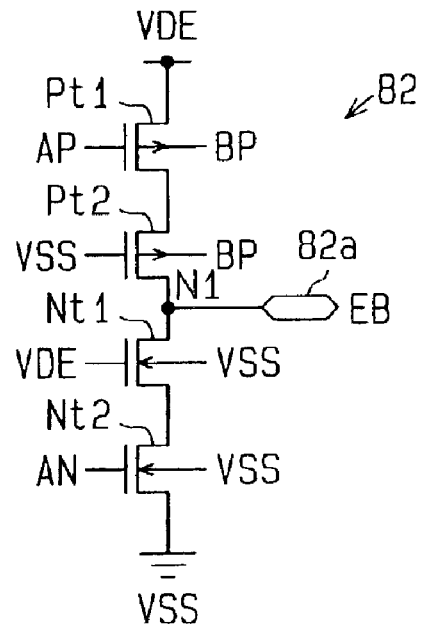
FIG. 4 is a circuit diagram illustrating an input/output buffer of FIG. 3.
Figure 9:
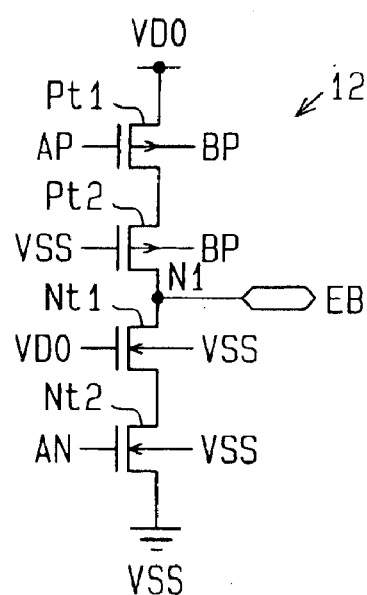
FIG. 9 is a circuit diagram illustrating an input/output circuit of the input/output buffer of FIG. 8.

FIG. 9 is a circuit diagram of the input/output circuit 12. The input/output circuit 12 includes PMOS transistors Pt1 and Pt2 and NMOS transistors Nt1 and Nt2. In the input/output circuit 12, the source of the transistor Pt1 and the gate of the transistor Nt1 are supplied with the reference power VDO. The remaining parts of the input/output circuit 12 are the same as those of the input/output circuit 82 illustrated in FIG. 4.

Figure 5:
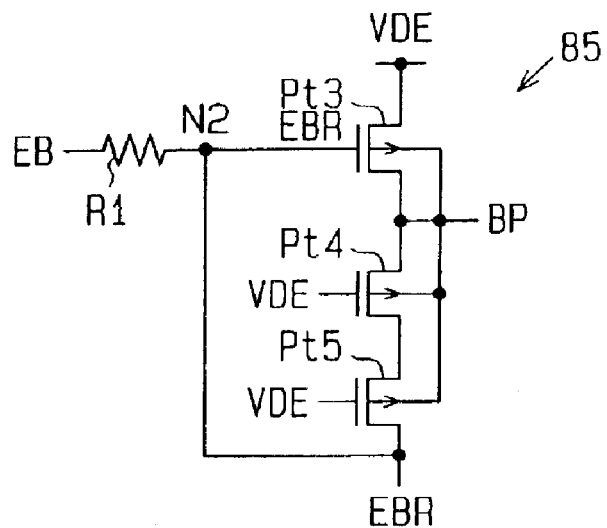
FIG. 5 is a circuit diagram illustrating a tolerant circuit of the input/output buffer of FIG. 3.
Figure 10:
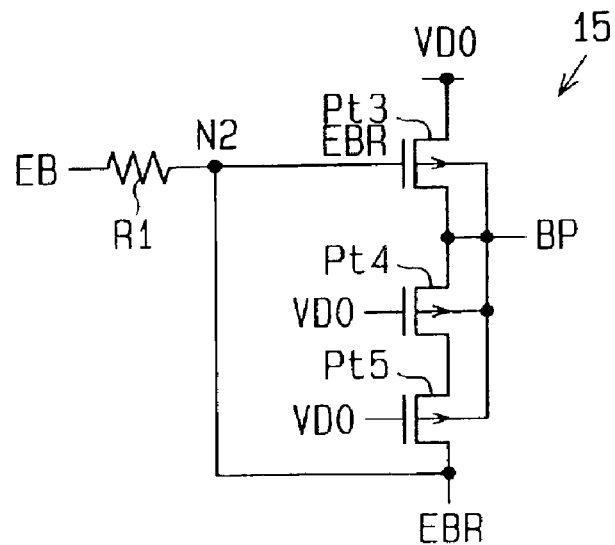
FIG. 10 is a circuit diagram illustrating a tolerant circuit of the input/output buffer of FIG. 8.

FIG. 10 is a circuit diagram of the tolerant circuit 15. The tolerant circuit 15 includes a resistor RI, which is a protection resistor, and PMOS transistors Pt3 to Pt5. In the tolerant circuit 15, the source of the transistor Pt3 and the gates of the transistors Pt4 and Pt5 are supplied with the reference power supply VDO. The remaining parts of the tolerant circuit 15 are the same as those of the tolerant circuit 85 illustrated in FIG. 5.

Figure 6:
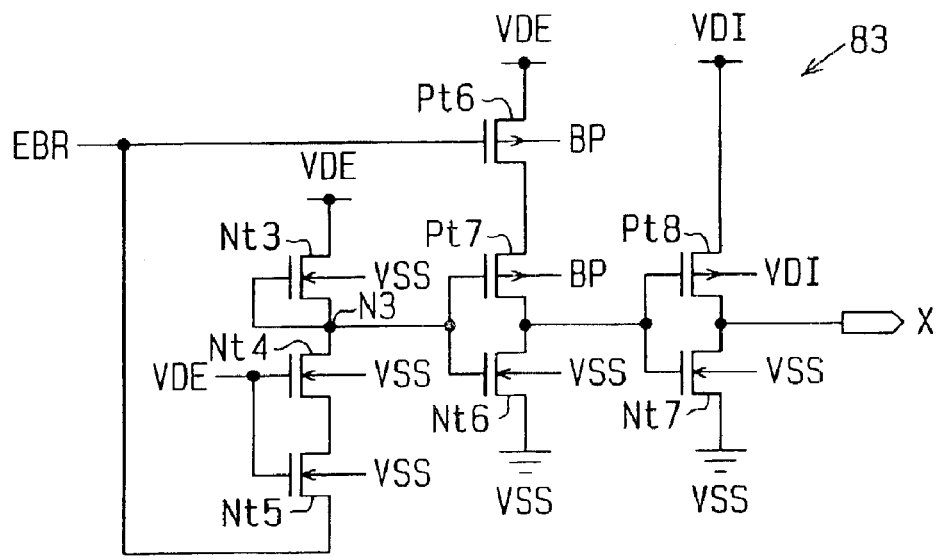
FIG. 6 is a circuit diagram illustrating an input circuit of the input/output buffer of FIG. 3.
Figure 7:
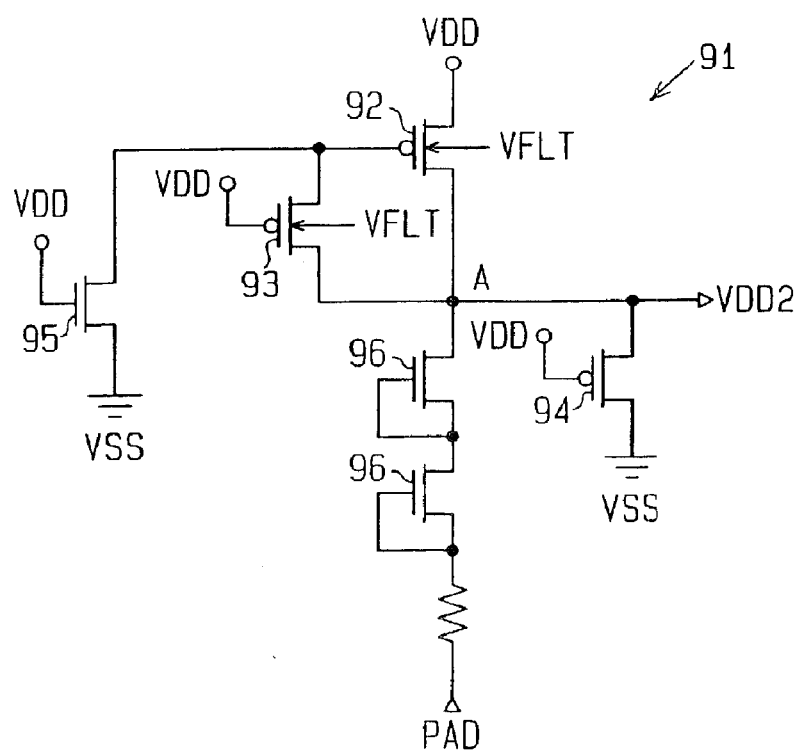
FIG. 7 is a circuit diagram of a prior art voltage generator.
Figure 11:
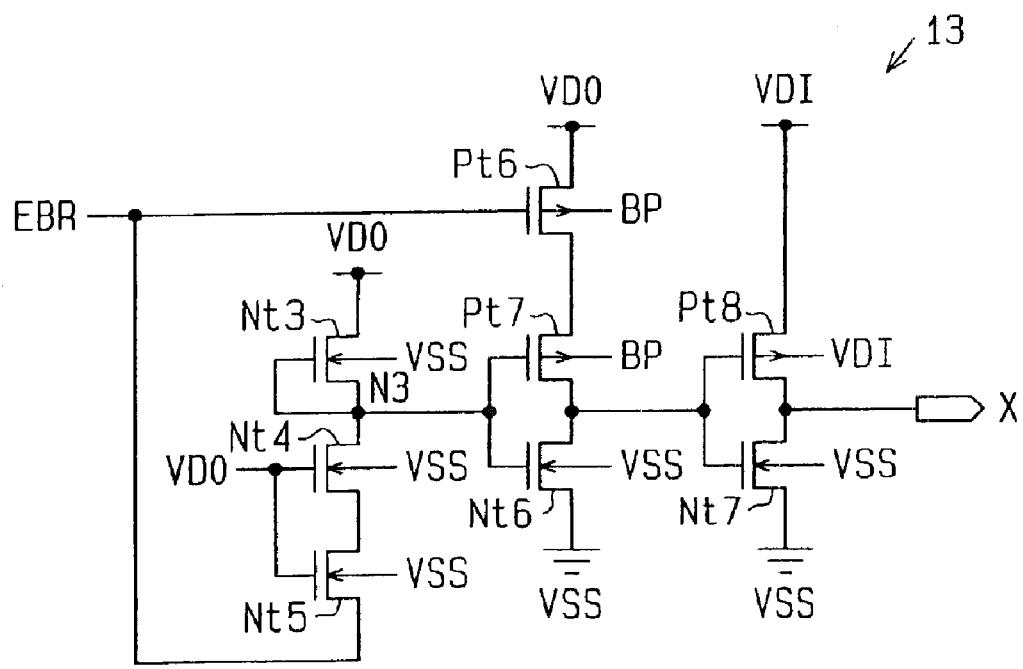
FIG. 11 is a circuit diagram illustrating an input circuit of the input/output buffer of FIG. 8.

FIG. 11 is a circuit diagram of the input circuit 13. The input circuit 13 includes PMOS transistors Pt6 to Pt8 and NMOS transistors Nt3 to Nt7. In the input circuit 13, the source of the transistor Pt6, the drain of the transistor Nt3, and the gates of the transistors Nt4 and Nt5 are supplied with the reference power VDO. The remaining parts of the input circuit 13 are the same as those of the input circuit 83 illustrated in FIG. 6.

Figure 12:
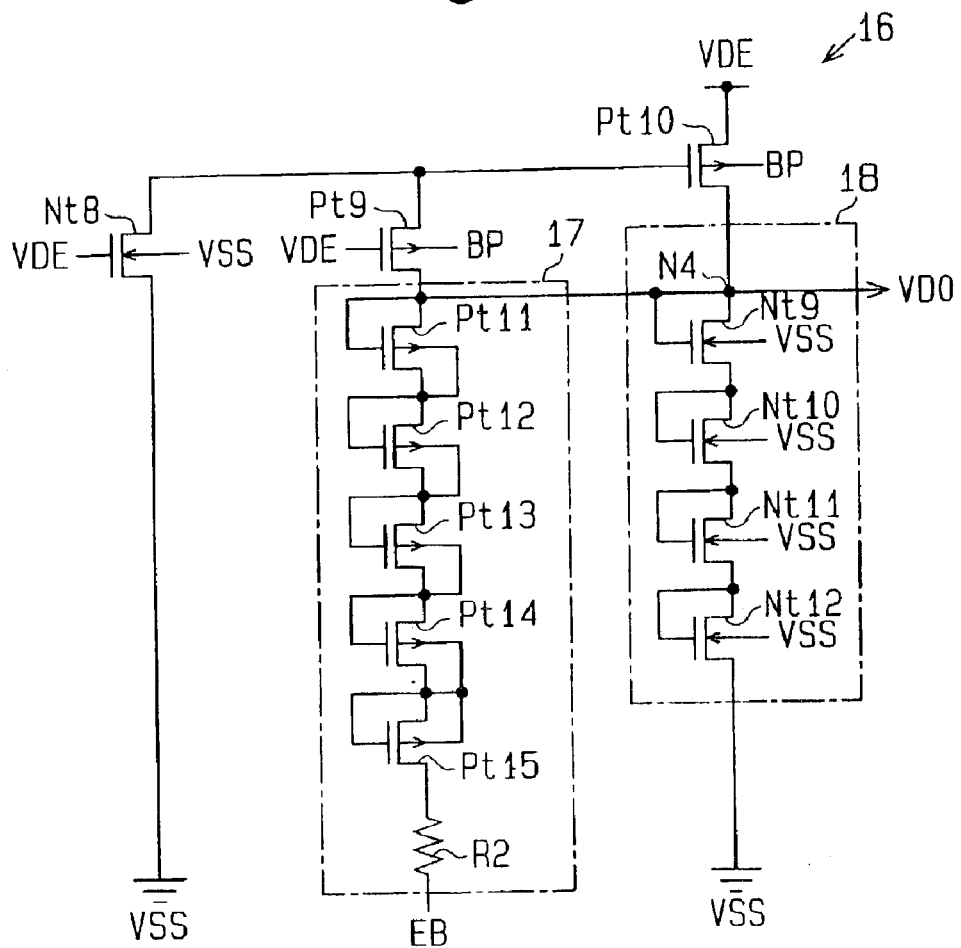
FIG. 12 is a circuit diagram illustrating a power generation circuit of the input/output buffer of FIG. 8.

FIG. 12 is a circuit diagram of the power generation circuit 16. The power generation circuit 16 includes PMOS transistors Pt9 to Pt15, NMOS transistors Nt8 to Nt12, and a resistor R2.

The gates of the transistors Nt8 and Pt9 and the source of the transistor Pt10 is connected to a high voltage power supply VDE (e.g., 3.3 V). The source of the transistor Nt8 is connected to a low voltage power supply VSS (ground), and the drain of the transistor Nt8 is connected to the source of the transistor Pt9 and the gate of the transistor Pt10. The back gate of the transistor Nt8 is connected to the low voltage power supply VSS. The back gates of the transistors Pt9 and Pt10 are connected to the output of the tolerant circuit 15 and have about the same voltage as the voltage signal BP.

The transistors Pt11 to Pt14 are connected in series to the drain of the transistor Pt9. The transistor Pt15 is connected to the transistor Pt14 so that the transistors Pt11 to Pt14 are connected in a reverse direction. The voltage signal EB is input to the drain of the transistor Pt15 via the resistor R2, which is used for electrostatic discharge (ESD) protection.

The transistors Nt9 to Nt12 (voltage-maintaining circuit 18) are connected in series. The gate of each of the transistors Nt9 to Nt12 is connected to the associated drain, and the back gate of each of the transistors Nt9 to Nt12 is connected to the low voltage power supply VSS. The source of the transistor Nt12 is connected to the low voltage power supply VSS. The drain of the transistor Nt9 is connected to the source of the transistor Pt10 and the source of the transistor Pt11. The power generation circuit 16 outputs the reference power VDO, the voltage of which is the same as the voltage at node N4.

In the power generation circuit 16, the transistors Pt11 to Pt15, which are diode-connected, function as a protection circuit 17.

Figure 13:
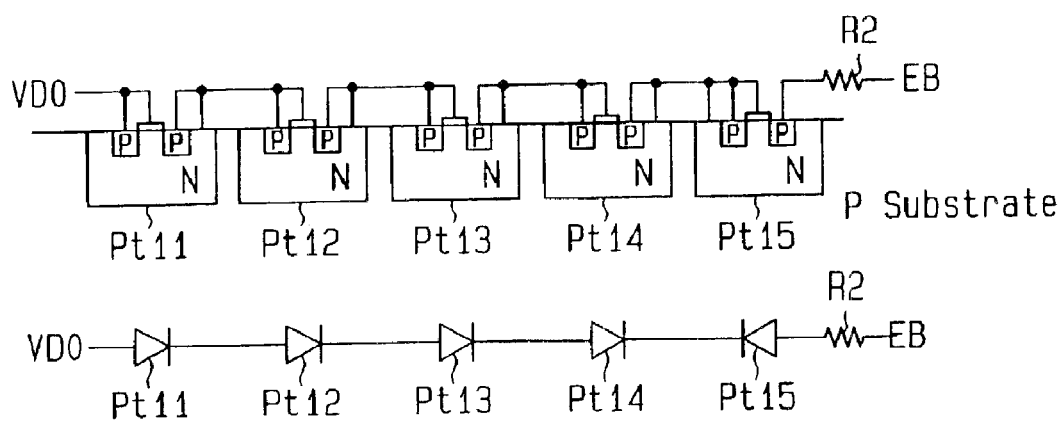
FIG. 13 is an explanatory diagram illustrating a protection circuit of the power generation circuit of FIG. 12.

FIG. 13 is an explanatory diagram illustrating the transistor configuration in the protection circuit 17. As shown in FIG. 13, the transistors Pt11 to Pt15 are PMOS transistors formed on, for example, a p-type silicon substrate. The back gate of each of the transistors Pt11 to Pt14 is connected to the associated drain, and the back gate of the transistor Pt15 is connected to the source of the transistor Pt15.

The transistors Pt11 to Pt14 receive the reference power VDO in the forward direction (PN). The transistor Pt15 receives the reference power VDO in the reverse direction. That is, the transistors Pt11 to Pt15 are diode-connected to receive the reference power VDO in the manner of PN-PN-PN-PN-NP.

The operation of the input/output buffer 11 of the first embodiment will now be discussed with reference to FIG. 14. FIG. 14 is an explanatory diagram illustrating an operation example of the power generation circuit 16.

A case in which the input/output buffer 11 is supplied with power (high voltage power supply VDE=3.3 V) will first be discussed. In this case, in the power generation circuit 16, the transistor Nt8 switches on and connects the gate of the transistor Pt10 to the low voltage power supply VSS. This activates the transistor Pt10. In this state, referring to FIG. 14, the power generation circuit 16 generates the reference power VDO, the voltage of which is the same as the high voltage power supply VDE, regardless of the voltage of the voltage signal (external input signal) EB. Even when the voltage signal EB, the voltage (e.g., 6 V) of which is greater than the high voltage power supply VDE, is input, the transistors Nt11 to Nt15 decreases the voltage of the voltage signal EB to the voltage of the high voltage power supply VDE (3.3 V). Thus, the reference power VDO is output at about 3.3 V.

A case in which the input/output buffer 11 is not supplied with power (i.e., the high voltage power supply VDE being substantially 0 V) will now be discussed.

In this case, the transistor Nt8 switches off and the transistor Pt9 switches on in the power generation circuit 16. In this state, the transistor Pt10 switches off and the power generation circuit 16 generates the reference power VDO, the voltage of which is in accordance with the voltage signal EB, as shown in FIG. 14.

More specifically, when the input voltage signal EB, has a voltage that is substantially the same as the low voltage power supply VSS, the voltage of the reference power VDO becomes the same as that of the low voltage power supply VSS (0 V). When the input voltage signal EB has a voltage that is substantially the same as the high voltage power supply VSS (about 3.3 V), the power generation circuit 16 generates the reference power VDO (in FIG. 14, 2.07 V), the voltage of which is obtained by decreasing the voltage of the voltage signal EB with the transistors Pt11 to Pt15.

When the input voltage signal EB has a voltage (e.g., 6 V) that is greater than that of the high voltage power supply VDE, the power generation circuit 16 generates the reference power VDO (in FIG. 14, 3.62 V), the voltage of which is obtained by decreasing the voltage of the voltage signal EB with the transistors Pt11 to Pt15.

In this manner, the power generation circuit 16 generates the reference power VDO at about 3 V even if the voltage signal EB is input when the power generation circuit 16 is not supplied with power (high voltage power supply VDE).

A plurality (four in the first embodiment) of transistors Nt9 to Nt12 are connected between the node N4 and the low voltage power supply VSS (refer to FIG. 12). Thus, the leakage current flowing through the transistors Nt9 to Nt12 is small. In this case, the gate voltages at the transistors Nt9 to Nt12 are respectively 3.3 V, 2.16 V, 1.24 V, and 0.52 V, and the leakage current in the path of the transistors Nt9 to Nt12 is reduced to several tens of nanoamperes.

Since the transistor Pt15 is connected to the transistors Pt11 to Pt14 in the reverse direction (NP) and is reverse biased, reverse leakage current does not flow through the path of the transistors Pt11 to Pt15. The gates of the transistors Pt11 to Pt15 are connected to a lower voltage side (source side) when the voltage signal EB decreases voltage. Thus, the transistors Pt11 to Pt15 stably function. In addition to suppressing device deterioration, which is caused by an increase in the resistance component, and voltage fluctuation of the reference power VDO, the intended reference power VDO is accurately generated. Further, the power generation circuit 16 has the ESD protection resistor R2. Thus, voltage fluctuation is suppressed even when the voltage of the voltage signal EB changes drastically.

The reference power VDO generated by the power generation circuit 16 is supplied to the input/output circuit 12, the input circuit 13, and the output circuit 14. Thus, regardless of whether the high voltage power supply VDE is supplied, damage to devices and the occurrence of a leakage current is prevented in the input/output buffer 11 regardless of the voltage of the voltage signal EB.

Figure 15:
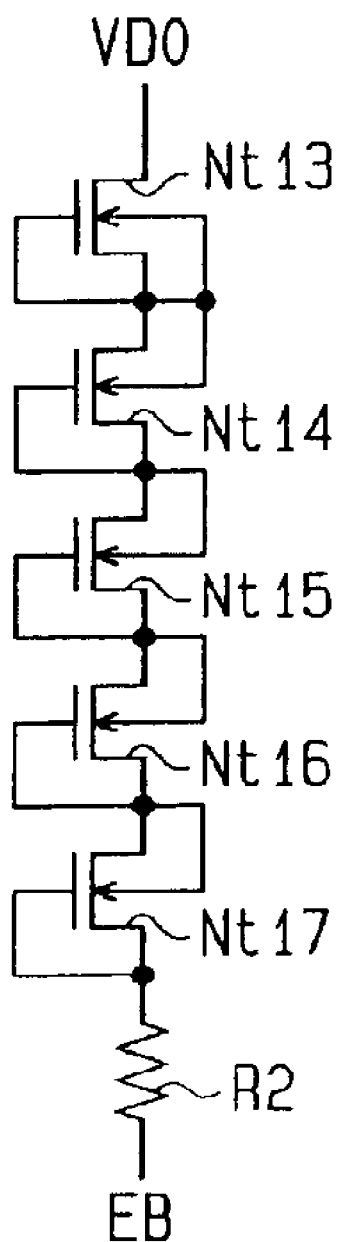
FIG. 15 is an explanatory diagram illustrating a further example of a protection circuit.
Figure 15:
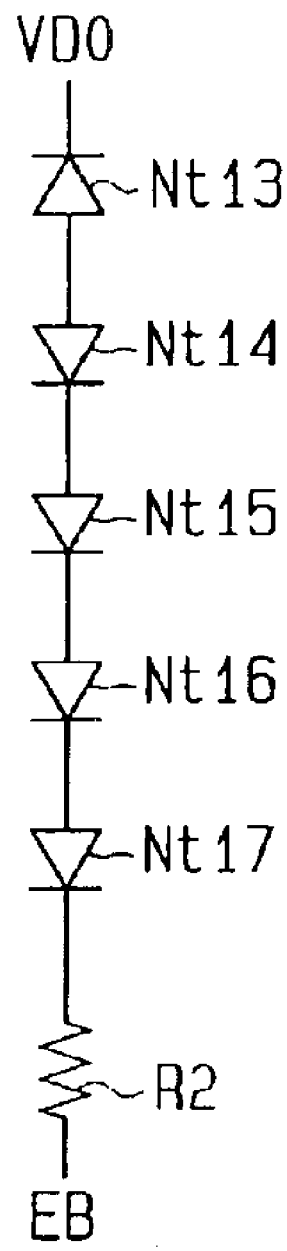

In the power generation circuit 16 of the first embodiment, the protection circuit 17 may be configured by NMOS transistors Nt13 to Nt17 as shown in FIG. 15. More specifically, the transistor Nt13 receives the reference power supply VDO in the reverse direction (NP). The other transistors Nt14 to Nt17 are connected in a direction that is reversed from the connection direction of the transistor Nt13. That is, the transistors Nt13 to Nt17 are diode-connected to receive the reference voltage VDO in the manner of NP-PN-PN-PN-PN. In this case, the transistor Nt13 stops reverse current leakage.

The gates of the transistors Nt13 to Nt17 are each connected to the higher voltage side (i.e., drain side) when the voltage is decreased. Thus, the transistors Nt13 to Nt17 are stably operated, fluctuation of the reference power VDO caused by an increase in the resistance component is suppressed, and the reference power VDO is accurately generated with the intended voltage.

The NMOS transistor protection circuit is more useful than the PMOS transistor protection circuit when laid out on an n-type silicon substrate. That is, when PMOS transistors (transistors Pt11 to Pt15) are laid out on an n-type silicon substrate, a tripe well transistor configuration becomes necessary. As the layout area increases, the number of reticles and the number of processing operations increase. This increases costs. Accordingly, it is preferred that the protection circuit 17 be configured by PMOS transistors (transistors Pt11 to Pt15) when using a p-type silicon substrate and that the protection circuit 17 be configured by NMOS transistors (transistors Nt13 to Nt17) when using an n-type silicon substrate.

Figure 16B:
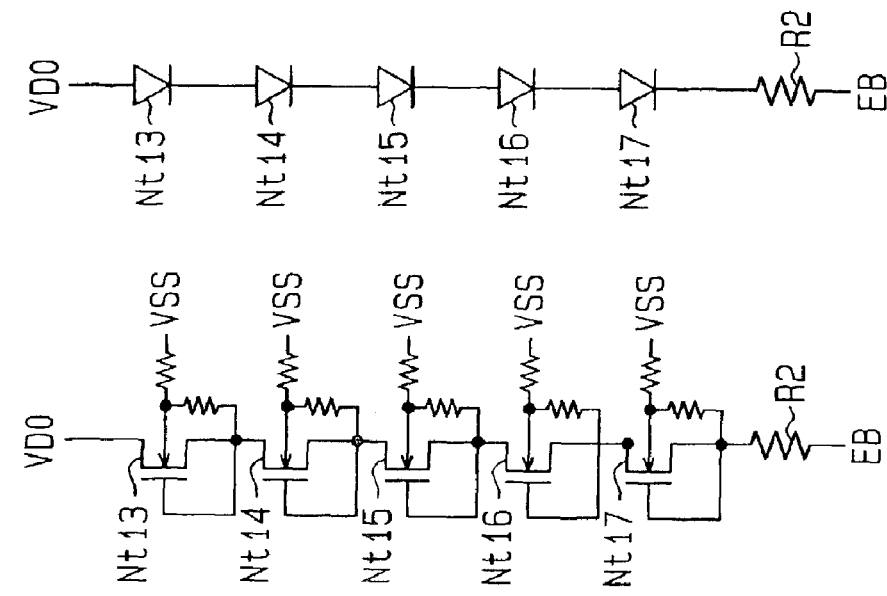
FIGS. 16A and 16B are explanatory diagrams illustrating further examples of a protection circuit.
Figure 16A:
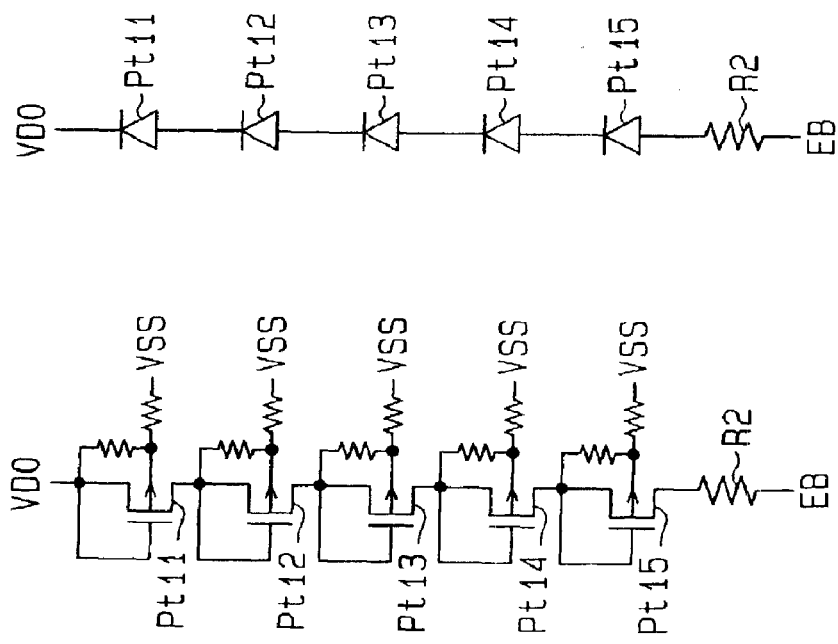

The protection circuit 17 may further be configured as shown in FIGS. 16A and 16B. In FIG. 16A, the voltages at the back gates of the PMOS transistors Pt11 to Pt15 are each generated from the divisional voltage of the source voltage and the low voltage power supply VSS. The transistors Pt11 to Pt15 are diode-connected to receive the reference power VDO in the manner of NP-NP-NP-NP-NP.

In FIG. 16B, the back gate voltages of the NMOS transistors Nt13 to Nt17 are each generated from the divisional voltage of the drain voltage and the low voltage power supply VSS. Each transistor Nt13 to Nt17 are diode-connected to receive the reference power VDO in the manner of PN-PN-PN-PN-PN. In the protection circuits of FIGS. 16A and 16B, damage to the device and the occurrence of leakage current caused by the low back gate voltage is prevented.

The input/output buffer 11 of the first embodiment has the advantages described below.

(1) The power generation circuit 16 of the input output buffer 11 converts the voltage signal EB, which is input from an external device, to a proper voltage corresponding to the high voltage power supply VDE and generates the reference power VDO. The power generation circuit 16 includes diode-connected transistors Pt11 to Pt15 (protection circuit 17). Further, the back gates of the transistors Pt11 to Pt15 are connected to a node at which the voltage is one other than that of the high voltage power supply VDE and the low voltage power supply VSS. Thus, regardless of whether the high voltage power supply VDE is being supplied, when the voltage signal EB is input, high voltage is prevented from being applied between the gate and back gate of each of the transistors Pt11 to Pt15, and deterioration and damage to the transistor is prevented.

(2) Among the transistors Pt11 to Pt15, the transistors Pt11 to Pt14 are diode-connected to receive the reference power VDO in the forward bias direction (forward direction), and the transistor Pt15 is diode-connected to receive the reference power VDO in the reverse bias direction (reverse direction). Thus, when the reference power VDO is generated, reverse leakage current is not produced and the reference power VDO is maintained at the intended voltage.

(3) The gate of each of the transistors Pt11 to Pt15 is connected to the associated source. When the input voltage signal EB has a voltage that is greater than the voltage of the high voltage power supply VDE and the voltage signal EB causes a decrease in voltage, the source voltage is less than the drain voltage. Thus, the increase in the resistance of the transistors Pt11 to Pt15 prevents voltage fluctuation of the reference power VDO.

(4) The power generation circuit 16 includes a voltage-maintaining circuit 18, which is configured by transistors Nt9 to Nt12. The gate of the transistor Nt9 is connected to the reference power VDO, and the gates of the transistors Nt10 to Nt12 are connected to the high voltage side terminal (drain). Thus, the leakage current that flows through the transistors Nt9 to Nt12 is minimized.

Figure 17:
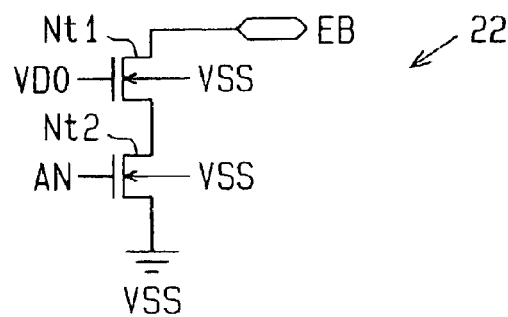
FIG. 17 is a circuit diagram illustrating an input/output circuit according to a second embodiment of the present invention.

FIG. 17 is a circuit diagram illustrating an input/output circuit 22 of an input/output buffer 11A according to a second embodiment of the present invention. The input/output buffer 11A of the second embodiment is used as a game port (joystick port) to which a joystick is connected. The input/output buffer 11A is configured by partially modifying the input/output circuit 12 and input circuit 13 of the input/output buffer 11 in the first embodiment.

The input/output circuit 22 includes two NMOS transistors Nt1 and Nt2 and is provided with an open drain output function. This is because the input/output buffer 11A, which is used as a joystick port, detects position information of the joystick during a period in which the input/output buffer 11A is pulled-up to a power supply of +5 V and the input/output circuit 22 does not require an output having a high level.

Figure 18A:
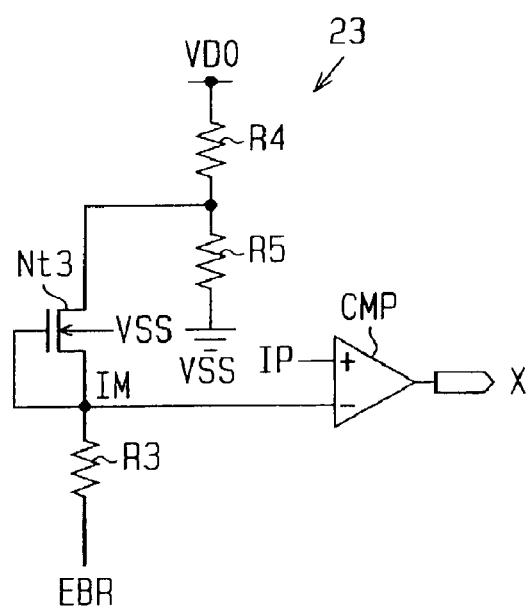
FIGS. 18A and 18B are circuit diagrams illustrating input circuits of the second embodiment.
Figure 18B:
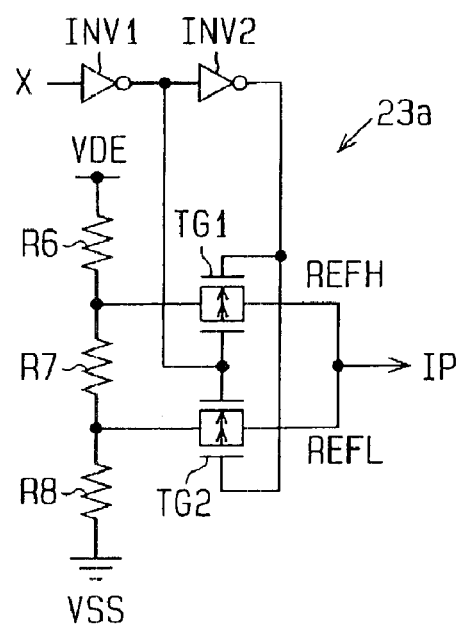

FIG. 18A is a circuit diagram illustrating an input circuit 23 of the input/output buffer 11A. The input circuit 23 includes an NMOS transistor Nt3, resistors R3 to R5, a comparator CMP, and a reference circuit 23a. As shown in FIG. 18A, a voltage signal EBR is input to the source of the transistor Nt3 via the resistor R3. Voltage generated by dividing the reference power VDO with the resistors R4 and R5 is input to the drain of the transistor Nt3. The gate and source of the transistor Nt3 are connected to each other. The voltage at a node TM between the source of the transistor Nt3 and the resistor R3 is input to an inverting input terminal of the comparator CMP. A reference voltage signal IP from a reference circuit 23a, which is shown in FIG. 18B, is input to a non-inverting terminal of the comparator CMP. The comparator CMP compares the voltage at the node IM with the voltage of the reference voltage signal IP and generates a signal X at a low level or a high level in accordance with the comparison.

The reference circuit 23a includes resistors R6 to R8, inverter circuits INV1 and INV2, and transfer gates TG1, TG2. Each of the transfer gates TG1 and TG2 includes a PMOS transistor and an NMOS transistor. High voltage side divisional voltage generated from power supply VDE by resistors R6 to R8 is input to the input terminal of the transfer gate TG1. Low voltage side divisional voltage is input to the input terminal of the transfer gate TG2.

The PMOS transistor gate of the transfer gate TG1 and the NMOS transistor gate of the transfer gate TG2 are connected to each other, and the signal X is input to each gate from the comparator CMP via an inverter circuit INV2. Further, the signal X is input to the NMOS transistor gate of the transfer gate TG1 and the PMOS transistor gate of the transfer gate TG2 via the inverter circuits INV1 and INV2.

The transfer gates TG1, TG2 are activated and inactivated in a complementary manner in accordance with the signal X in the reference circuit 23a. The reference circuit 23a generates the reference voltage signal IP having reference voltage REFH when the transfer gate TG1 switches on and generates the reference voltage signal IP having reference voltage REFL when the transfer gate TC2 is activated.

The operation of the input/output buffer 11A, which includes the input circuit 23, will now be discussed. Normally, in an input/output buffer used as the joystick port, a threshold voltage for recognizing an input as a high level (threshold voltage VIL) and a threshold voltage for recognizing an input as a low level (threshold voltage VIL) are both set at about 3.0 V (power supply voltage (high voltage power supply VDE=3.3 V) −0.3 V). That is, in the input/output buffer of the joystick port, the voltage difference between the source and gate of the transistor functioning in accordance with the threshold voltage is about 0.3 V and small. Thus, the operation of the transistor may be instable.

In the input circuit 23 of the second embodiment, the voltage signal EBR is input to the source of the transistor NT3. Thus, the voltage at node IM may be increased to the threshold voltage (about 3.0 V) in accordance with the voltage level of the voltage signal EB (external input signal). In this state, voltage generated by dividing the reference power VDO with the resistors R4 and R5 is input to the drain of the transistor Nt3. This prevents the voltage at the node IM from exceeding a predetermined value.

The reference circuit 23a generates the reference voltage signal IP having the reference voltage REFH (e.g., 3.1 V) at a timing in which the signal X shifts from a low level to a high level. Further, the reference circuit 23a generates the reference voltage signal IP having the reference voltage REFL (e.g., 3.1 V) at a timing in which the signal X shifts from a high level to a low level. That is, the reference circuit 23a, which functions as a Schmitt trigger circuit, stabilizes the output of the comparator CMP.

Accordingly, the input/output buffer 11A of the second embodiment operates stably even when the threshold voltage of an input is high (e.g., 3.0 V) and is especially useful for a joystick port that detects the position information of the joystick.

Figure 19:
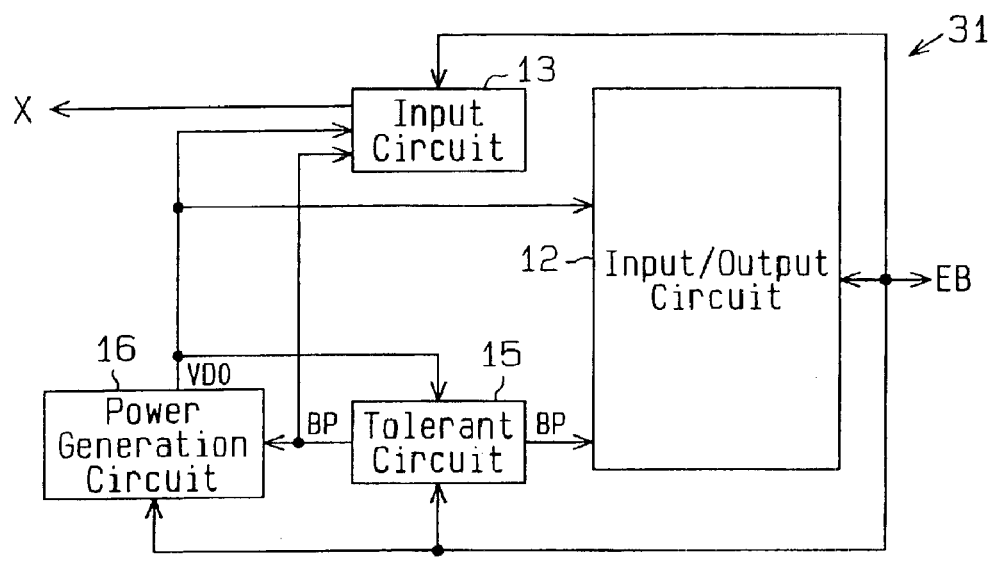
FIG. 19 is a schematic block diagram illustrating an input buffer according to a third embodiment of the present invention.
Figure 20:
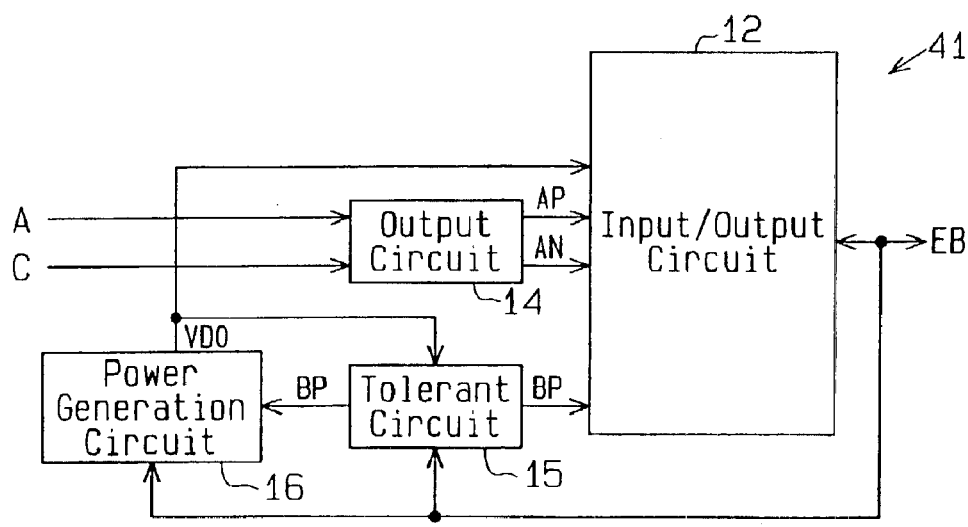
FIG. 20 is a schematic block diagram illustrating an output buffer of the third embodiment.

FIG. 19 is a schematic block diagram of an input buffer 31 according to a third embodiment of the present invention. FIG. 20 is a schematic block diagram of an output buffer 41. In the third embodiment, the input/output buffer 11 (refer to FIG. 8) of the first embodiment is used to configure either the input buffer or the output buffer.

That is, as shown in FIG. 19, the output circuit 14 is deleted from the input/output buffer 11 of the first embodiment. When using the input buffer 31 as a joystick port, the input/output circuit 22 (FIG. 17) and the input circuit 23 (FIG. 18) of the second embodiment may be employed in lieu of the input/output circuit 12 and the input circuit 13. Referring to FIG. 20, in the output buffer 41, the input circuit 13 is eliminated from the input/output buffer 11 of the first embodiment.

An input buffer according to a fourth embodiment of the present invention will now be discussed with reference to FIGS. 21A to 24B. In the fourth embodiment, to reduce power consumption, the input buffer includes a pull-up resistor for fixing the voltage signal EB (external input signal) at a high level or a pull-down resistor for fixing the voltage signal EB at a low level.

Figure 21A:
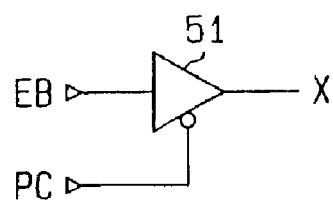
FIGS. 21A to 21C are explanatory diagrams illustrating a pull-up input buffer according to a fourth embodiment of the present invention.
Figure 21B:
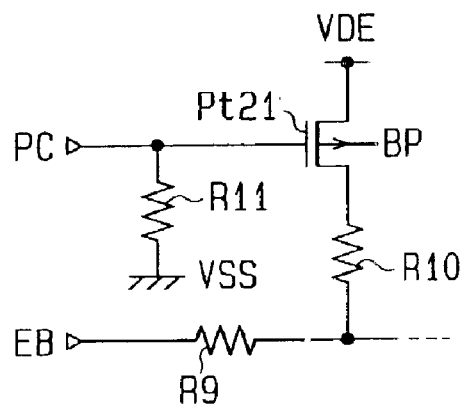

An input buffer 51 incorporating a pull-up resistor will now be discussed. As shown in FIG. 21A, a control signal PC for electrically disconnecting the input buffer 51 from a pull-up resistor is normally input when testing the input buffer 51. More specifically, as shown in FIG. 21B, an input terminal of the voltage signal EB in the input buffer 51 is connected to one end of an input protection resistor R9. The other end of the resistor R9 is connected to a high voltage power supply VDE via a pull-up resistor R10 and a PMOS transistor Pt21 (switch device). The control signal PC is input to the gate of the transistor Pt21. The gate of the transistor Pt21 is connected to a low voltage power supply VSS (ground) via a pull-down resistor R11, which stabilizes the input level of the control signal PC.

Normally, the control signal PC activates the transistor Pt21 and connects the power supply VDE to the pull-up resistor R10 in the input buffer 51. When conducting a test, the control signal PC inactivates the transistor Pt21 and disconnects the power supply VDE from the pull-up resistor R10. Thus, leakage current does not flow through the pull-up resistor R10 when conducting a test, and the testing of an internal circuit of the input buffer is accurately conducted.

Figure 21C:
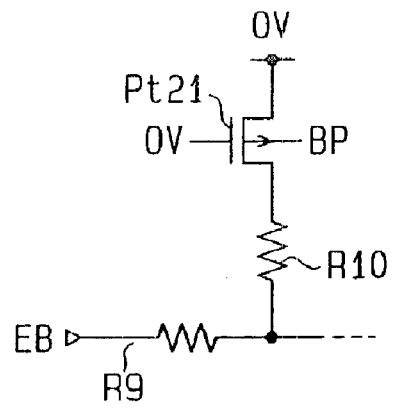

When the input buffer 51 enters a fail-safe mode in a state in which the power supply VDE has 0 V, the voltage signal EB has 5 V, and the control signal has 0 V, as shown in FIG. 21C, a voltage difference of 5 V is produced between the source and drain and drain and gate of the transistor Pt21. Accordingly, there is a need to prevent the transistor Pt21 from being damaged in the fail-safe mode.

FIGS. 22A and 22B are explanatory diagrams illustrating an input buffer 51a that is suitable for the fail-safe mode. As shown in FIG. 22A, the control signal PC is input to the gate of the transistor Pt21 via an inverter circuit 52 and a NAND circuit 53 in the input buffer 51A. The source of the transistor Pt21 receives the reference power VDO (refer to FIG. 12).

In the input buffer 51a, a signal having a high level is input to the gate of the transistor Pt21 (referred to as P-Gate in FIG. 22B) in the fail-safe mode (i.e., when the high voltage power supply VDE has 0 V). More specifically, if the control signal PC is input at a low level (0 V) when the power supply VDE has 0 V, a signal having a high level is input to the gate of the transistor Pt21. Further, if the control signal PC is input at a high level (3.3 V) when the power supply VDE has 0 V, a signal having a high level is input to the gate of the transistor Pt21, as shown in FIG. 22B. In this state, the transistor Pt21 is inactivated and thus not damaged.

An input buffer incorporating a pull-down resistor will now be discussed. Referring to FIG. 23A, in an input buffer 61 including a pull-down resistor, an input terminal of the voltage signal EB is connected to one end of an input protection resistor R12. The other end of the resistor R12 is connected to a low voltage power supply VSS via a pull-down resistor R13 and an NMOS transistor Nt21 (switch device). The control signal PC is input to the gate of the transistor Nt21 via an inverter circuit 62. The gate of the transistor Nt21 is connected to a low voltage power supply VSS via a pull-down resistor R14 for stabilizing the input level of the control signal PC.

When the input buffer 61 enters the fail-safe mode, referring to FIG. 23B, a voltage difference of 5 V is produced between the source and drain, the drain and gate, and the drain and back gate of the transistor Nt21. Accordingly, there is a need to prevent the transistor Nt21 from being damaged in the fail-safe mode.

Figures 24A, 24B:
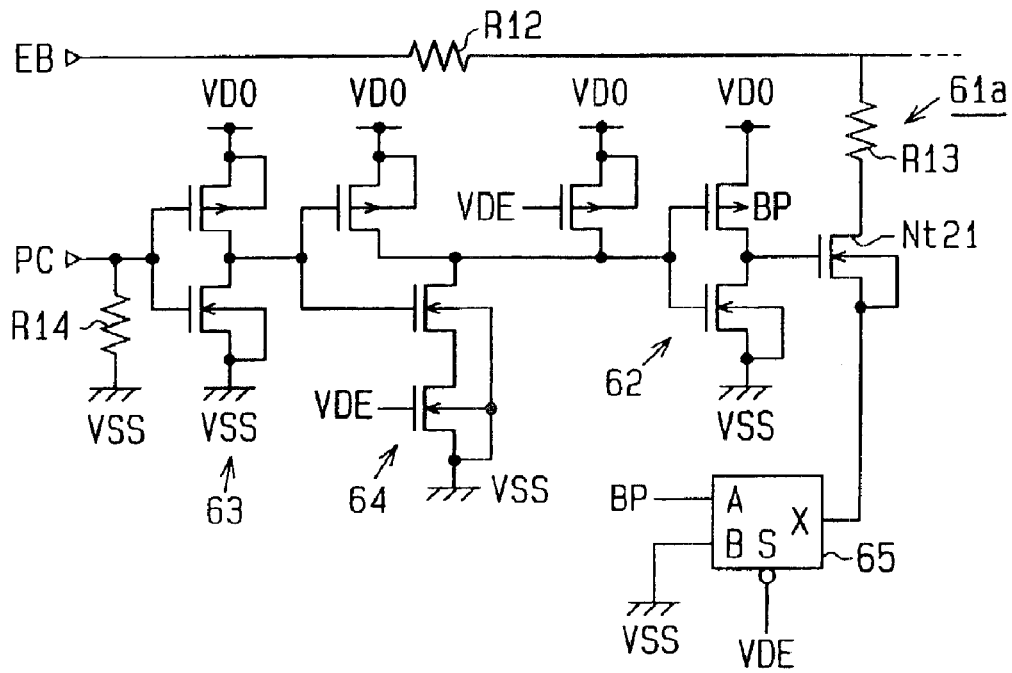
FIGS. 24A and 24B are explanatory diagrams illustrating the input buffer of FIGS. 23A and 23B provided with a fail-safe function.

FIGS. 24A and 24B are explanatory diagrams of an input buffer 61a that is suitable for the fail-safe mode. As shown in FIG. 24A, in the input buffer 61a, the control signal PC is input to the gate of the transistor Nt21 via an inverter circuit 63, a NAND circuit 64, and an inverter circuit 62. The source of the transistor Nt21 is connected to the selector circuit 65. The selector circuit 65 controls the source voltage of the transistor Nt21 at the voltage of the low voltage power supply VSS or the voltage signal BP in accordance with whether or not power VDE is supplied.

In the input buffer 61a, a signal having a low level is input to the gate of the transistor Nt21 (referred to as N-Gate in FIG. 24B) in the fail-safe mode (i.e., when the high voltage power supply VDE has 0 V). More specifically, if the control signal PC is input at a low level (0 V) when the power supply VDE has 0 V, a signal having a low level is input to the gate of the transistor Nt21. Further, if the control signal PC is input at a high level (3.3 V) when the power supply VDE has 0 V, a signal having a low level is input to the gate of the transistor Nt21. In this state, the transistor Nt21 is inactivated and thus not damaged.

In the fourth embodiment, the devices of the input buffers 51a, 61a, which include a pull-up resistor or a pull-down resistor, are prevented from being damaged when the input buffers 51a, 61a enter the fail-safe mode.

It should be apparent to those skilled in the art that the present invention may be embodied in many other specific forms without departing from the spirit or scope of the invention. Particularly, it should be understood that the present invention may be embodied in the following forms.

Although the first embodiment employs five transistors Pt, any number of transistors may be used, for example, three, four, six, or at least five.

In the first embodiment, the MOS transistors (protection circuit) that decrease the voltage of the voltage signal EB may include p-channel MOS transistors and n-channel MOS transistors.

In the first embodiment, the transistor that undergoes reverse bias due to the reference power VDO is not limited to the transistor Pt15 and may be another transistor, such as the transistor Pt13 or the transistor Pt14. In the protection circuit 17 of FIG. 15, the transistor that undergoes reverse bias due to the reference power VDO is not limited to the transistor Nt13 and may be another transistor, such as one of the transistors Nt14 to Nt17. That is, the transistor that is in the reverse direction relative to the reference power VDO and undergoes reverse bias due to the reference power VDO is required only to be arranged at a position where it can stop a reverse current leakage.

In the first embodiment, the number of the n-channel MOS transistors in the voltage-maintaining circuit 18 is not limited to four and may be any number, for example, three, five, or at least two.

Figure 25A:
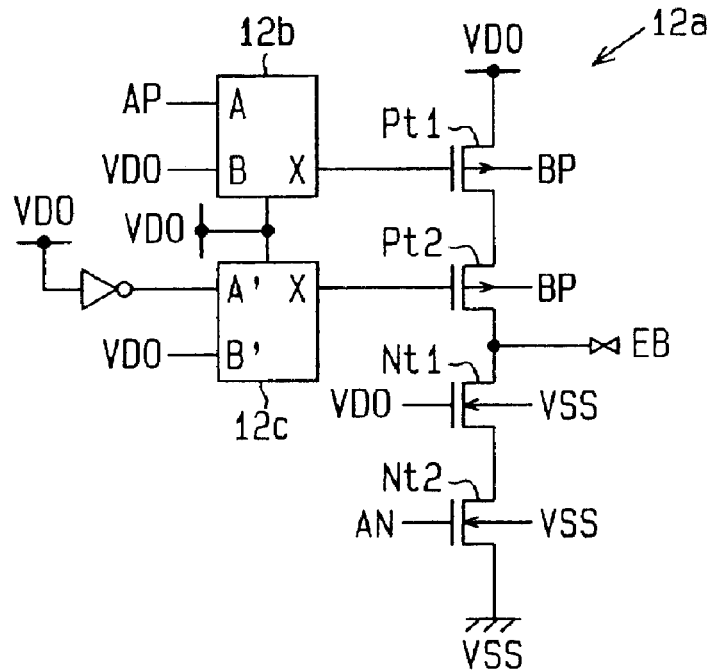
FIGS. 25A and 25B are explanatory diagrams of the input/output circuit of the first embodiment provided with a fail-safe function.
Figure 25B:
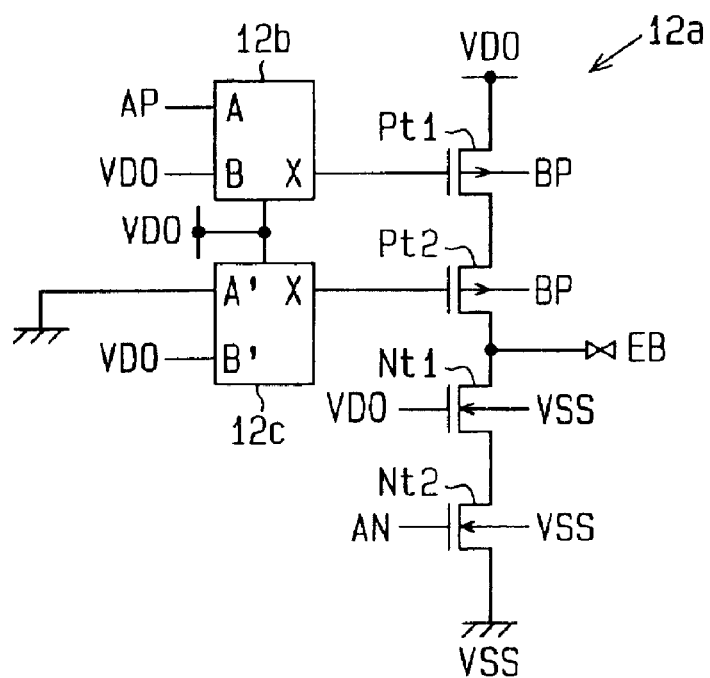

The input/output circuit 12 (FIG. 9) of the first embodiment may be replaced by an input/output circuit 12a that is illustrated in FIGS. 25A and 25B and suitable to a fail-safe mode. In the input/output circuit 12a of FIGS. 25A and 25B, the gate of the transistor Pt1 is connected to a selector circuit 12b. The selector circuit 12b normally provides a control signal AP (high level or low level), which is received from the output circuit 14 (FIG. 8), to the gate of the transistor Pt1. When entering the fail-safe mode, the selector circuit 12b supplies the reference power VDO to the gate of the transistor Pt1. The gate of the transistor Pt2 is connected to a selector circuit 12c. The selector circuit 12c normally connects the gate of the transistor Pt2 to the low voltage power supply VSS. During the fail-safe mode, the selector circuit 12c supplies the reference power VDO to the gate of the transistor Pt2. Thus, in the input/output circuit 12a, devices are prevented from being damaged during the fail-safe mode. This protects the input/output circuit 12a.

The present examples and embodiments are to be considered as illustrative and not restrictive, and the invention is not to be limited to the details given herein, but may be modified within the scope and equivalence of the appended claims.

What is claimed is:

1. An input/output buffer for use with a high voltage power supply that is variably provided and a low voltage power supply and receiving an external voltage signal, the input/output buffer comprising:
   a reference power generation circuit connected to the high voltage power supply and the low voltage power supply for converting the external voltage signal to a reference power, the reference power generation circuit having a protection circuit including a plurality of MOS transistors for decreasing the external voltage signal to a predetermined voltage when the input/output buffer receives the external voltage signal and is not supplied with the voltage of the high voltage power supply, each of the MOS transistors having a back gate connected to a predetermined node, each predetermined node having a voltage less than the voltage of the high voltage power supply and greater than the voltage of the low voltage power supply.

2. The input/output buffer according to claim 1, wherein the plurality of MOS transistors are connected in series and each MOS transistor is diode-connected, and wherein at least one of the MOS transistors is diode-connected so as to undergo reverse bias due to the reference power.

3. The input/output buffer according to claim 2, wherein the back gate of each MOS transistor is connected to a node between two adjacent MOS transistors.

4. The input/output buffer according to claim 1, wherein each of the MOS transistors is an n-channel MOS transistor.

5. The input/output buffer according to claim 4, wherein each n-channel MOS transistor includes a gate, a source terminal, and a drain terminal, and the gate is connected to the source terminal and drain terminal of the n-channel MOS transistor at which the voltage is greater when generating the reference power.

6. The input/output buffer according to claim 4, wherein the back gate of each n-channel MOS transistor is supplied with voltage generated by resistor-dividing the voltage difference between the voltage of the low voltage power supply and the greater one of the voltages at the source terminal and drain terminal of the n-channel MOS transistor when generating the reference power.

7. The input/output buffer according to claim 1, wherein each of the MOS transistors is a p-channel MOS transistor.

8. The input/output buffer according to claim 7, wherein each p-channel MOS transistor includes a gate, a source terminal, and a drain terminal, and the gate is connected to the source terminal and drain terminal of the p-channel MOS transistor at which the voltage is less when generating the reference power.

9. The input/output buffer according to claim 7, wherein each p-channel MOS transistor includes a back gate, a source terminal, and a drain, and the back gate is supplied with voltage generated by resistor-dividing the voltage difference between the voltage of the low voltage power supply and the lesser one of the voltages at the source terminal and drain terminal of the p-channel MOS transistor when generating the reference power.

10. The input/output buffer according to claim 1, wherein the reference power generation circuit includes a voltage-maintaining circuit having at least two MOS transistors connected in series between the reference power and the low voltage power supply, wherein each MOS transistor includes a gate, a source terminal, and a drain terminal, wherein the gate of the one of the at least two MOS transistors is connected to the reference power, and wherein the gate of each other one of the MOS transistors is connected via its drain terminal to the source terminal of the adjacent MOS transistor.

11. The input/output buffer according to claim 10, wherein the at least two MOS transistors are each an n-channel MOS transistor.

12. The input/output buffer according to claim 1, wherein the plurality of MOS transistors includes at least five MOS transistors.

13. The input/output buffer according to claim 1, further comprising:
   an internal circuit;
   an input circuit for generating a voltage signal having a voltage that is less than the external voltage signal, the input circuit providing in the voltage signal to the internal circuit;
   an output circuit for providing a data signal from the internal circuit to an external device; and
   an input/output circuit connected to the input circuit and the output circuit for invalidating an output of the output circuit and providing the external voltage signal to the input circuit when the internal circuit receives the data signal from the external device;
   wherein the input circuit, the output circuit, and the input/output circuit are each supplied with the reference power as operational power.

14. The input/output buffer according to claim 13, further comprising a tolerant circuit having a voltage that is equal to the voltage of the high voltage power supply when the external voltage signal is less than or equel to the voltage of the high voltage power supply, wherein the tolerant circuit generates the voltage signal having a voltage derived from the external voltage signal when the voltage of the external voltage signal is greater than the voltage of the voltage signal;

wherein the input/output circuit, the input circuit, and the reference power generation circuit each receive the voltage signal from the tolerant circuit.

15. A method for protecting an input/output buffer from a voltage signal that is provided from an external device, wherein the input/output buffer is connected to a high voltage power supply that is variably provided and a low voltage power supply and includes an input/output circuit for transferring data with the external device, the method comprising the steps of:

decreasing the voltage of the voltage signal to a predetermined voltage with a plurality of MOS transistors, which are connected in series between the high voltage power supply and the low voltage power supply, each MOS transistor having a back gate to generate reference power when the input/output buffer is not supplied with the voltage of the high voltage power supply;

supplying the input/output circuit with the reference power; and supplying the back gate of each MOS transistor with voltage that is less than the voltage of the high voltage power supply and greater than the voltage of the low voltage power supply.

16. The method according to claim 15, wherein the step of supply the back gate of each MOS transistor with voltage includes supplying the back gate with the voltage of a node between adjacent MOS transistors.

17. An input buffer for use with a high voltage power supply that is variably provided and a low voltage power supply and for receiving an external voltage signal, the input buffer comprising:

a reference power generation circuit connected to the high voltage power supply and the low voltage power supply for converting the external voltage signal to a reference power, the reference power generation circuit having a protection circuit including a plurality of MOS transistors for decreasing the external voltage signal to a predetermined voltage when the external voltage signal is received and the voltage of the high voltage power supply is not supplied, each of the MOS transistors having a back gate connected to a predetermined node, each predetermined node having a voltage less than the voltage of the high voltage power supply and greater than the voltage of the low voltage power supply.

18. The input buffer according to claim 17, further comprising:

an input circuit including an n-channel MOS transistor and a comparator connected to the n-channel MOS transistor, the n-channel MOS transistor including:
a source for receiving the external voltage signal via a resistor;
a gate connected to the source; and
a drain for receiving the reference power, the voltage of which is divided, by a divisional resistor;

wherein the comparator compares the external, voltage signal with a reference voltage signal to determine whether the voltage of the external voltage signal is greater than a predetermined threshold voltage from the comparison.

19. An output buffer for use with a high voltage power supply that is variably provided and a low voltage power supply and receiving an external voltage signal, the output buffer comprising:

a reference power generation circuit connected to the high voltage power supply and the low voltage power supply for converting the external voltage signal to a reference power, the reference power generation circuit having a protection circuit including a plurality of MOS transistors for decreasing the external voltage signal to a predetermined voltage when the output buffer receives the external voltage signal and is not supplied with the voltage of the high voltage power supply, each of the MOS transistors having a back gate connected to a predetermined node, each predetermined node having a voltage less than the voltage of the high voltage power supply and greater than the voltage of the low voltage power supply.

* * * * *